US008310279B2

(12) United States Patent
Sudjian

(10) Patent No.: US 8,310,279 B2
(45) Date of Patent: Nov. 13, 2012

(54) COMPARATOR WITH HYSTERESIS

(75) Inventor: Douglas Sudjian, Santa Clara, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 45 days.

(21) Appl. No.: 12/467,935

(22) Filed: May 18, 2009

(65) Prior Publication Data

US 2010/0289531 A1 Nov. 18, 2010

(51) Int. Cl.
*H03K 5/22* (2006.01)
(52) U.S. Cl. .............................. 327/65; 327/77; 327/205
(58) Field of Classification Search .................. 327/77, 327/205, 206, 65
See application file for complete search history.

(56) References Cited

U.S. PATENT DOCUMENTS

| | | | | | |
|---|---|---|---|---|---|
| 4,004,158 | A | * | 1/1977 | Morgan | 327/87 |
| 4,656,371 | A | * | 4/1987 | Binet et al. | 327/77 |
| 6,172,535 | B1 | | 1/2001 | Hopkins | |
| 6,362,467 | B1 | | 3/2002 | Bray | |
| 6,970,022 | B1 | * | 11/2005 | Miller | 327/77 |
| 2006/0082392 | A1 | | 4/2006 | Koo | |
| 2009/0027086 | A1 | | 1/2009 | Trifonov | |

OTHER PUBLICATIONS

International Search Report and Written Opinion—PCT/US2010/035086, International Search Authority—European Patent Office—Feb. 25, 2011.
Nandhasri, K. et al., "Hysteresis TunableFGMOS Comparator," Semiconductor Electronics, 2000. Proceedings. ICSE 2000. IEEE International Conference on; Digital Object Identifier: 10.1109/SMELEC.2000.932458; Publication Year: 2000, pp. 173-177.
Goll, B et al., "A Low-Power 2-Gsample/s Comparator in 120nm CMOS Technology," Solid-State Circuits Conference, 2005. ESSCIRC 2005. Proceedings of the 31st European; Digital Object Identifier: 10.1109/ESSCIR.2005.1541671; Publication Year: 2005, pp. 507-510.
Dey, Sanjoy et al., "An 8-bit, 3.8GHz Dynamic BiCMOS Comparator for High Performance ADC", VLSI Design, 2006. Held jointly with 5th International Conference on Embedded Systems and Design., 19th International Conference on; Digital Object Identifier: 10.1109NLSID.2006.35; Publication Year: 2006.
Goll, Bernhard et al., "A Low-Power 4GHz Comparator in 120nm CMOS Technology with a Technique to tune Resolution,"; Solid-State Circuits Conference, 2006. ESSCIRC 2006. Proceedings of the 32nd European; Publication Year: 2006 , pp. 320-323.
McCarroll, B.J.; Sodini, C.G.; Lee, H.-S.; A high-speed CMOS comparator for use in an ADC', Solid-State Circuits, IEEE Journal of; vol. 23 , Issue: 1; Digital Object Identifier: 10.1109/4.273; Publication Year: 1988, pp. 159-165.
Redman-White, William, "A High Bandwidth Constant gm and Slew-Rate Rail-toRail CMOS Input Circuit and its Application to Analog Cells for Low Voltage VLSI Systems"; IEEE JSSC, vol. 32, No. 5, May 1997.

(Continued)

*Primary Examiner* — Lincoln Donovan
*Assistant Examiner* — Shikha Goyal
(74) *Attorney, Agent, or Firm* — Ramin Mobarhan

(57) ABSTRACT

Techniques for providing a comparator incorporating amplitude hysteresis. In an exemplary embodiment, a current offset stage is coupled to a comparator having a folded cascode architecture. The current offset stage offsets the current generated from an input stage to delay switching of the comparator output to implement amplitude hysteresis. In an exemplary embodiment, rail-to-rail input voltages may be accommodated by providing dual NMOS and PMOS input stages. In another exemplary embodiment, the amplitude hysteresis may be controlled by an adjustable threshold voltage. In yet another exemplary embodiment, a constant transconductance $g_m$ bias circuit may be provided to maintain the stability of the threshold voltage across input common-mode voltage and/or other variations.

25 Claims, 13 Drawing Sheets

OTHER PUBLICATIONS

Razavi, Behzad, et al.: "Design Techniques for High-Speed, High Resolution Comparators,"; IEEE JSSC, vol. 27, No. 12 Dec. 1992, pp. 1916-1926.

Jia Chen et al.; "A low-kickback-noise latched comparator for high-speed flash analog-to-digital converters", Communications and Information Technology, 2005. ISCIT 2005. IEEE International Symposium on; vol. 1; Publication Year: 2005, pp. 259-262.

David Allstot; "A precision Variable-Supply CMOS Comparator"; IEEE JSSC, vol. SC-17, No. 6, Dec. 1982, pp. 1080-1087.

Bing Zhao et al., "Single Event Transients Characterization in SOI CMOS Comparators"; IEEE Transactions on Nuclear Science, vol. 51, No. 6, Dec. 2004, pp. 3360-3364.

Guo Xiaofeng et al. "Design and application of the novel low-threshold comparator using hysteresis ", ASIC, 2005.ASICON 2005. 6th International Conference on vol. 1; Digital Object Identifier: 10.1109/ICASIC.2005.1611329; Publication Year: 2005, pp. 549-553.

CMOS Circuit Design, Layout and Simulation, Baker, Li, Royce, IEEE Press Series on Microelectronic Systems, 1998; ISBN 0-7803-3416-7, pp. 685-703.

Analog Integrated Circuit Design, Johns, Martin, John Wiley and Sons, ISBN 0-471-14448-7, pp. 302-327.

* cited by examiner $V_{in} = V_p - V_n$

COMPARATOR WITH HYSTERESIS

BACKGROUND

1. Field

The disclosure relates to integrated circuit (IC) design, and more particularly, to the design of IC comparators with built-in hysteresis.

2. Background

In circuit design, a comparator is used to compare the levels of two input voltages, and to generate a logical high or low output signal depending on which input voltage is greater. Comparators find wide application in electronics, e.g., to monitor for when certain voltage levels in a circuit exceed a predetermined reference level.

To improve performance in the presence of noise, some comparators may incorporate amplitude hysteresis. Amplitude hysteresis delays the switching of the comparator output until the difference between the input voltages exceeds a certain minimum threshold voltage. To control the amount of amplitude hysteresis, the minimum threshold voltage may be made adjustable.

It would be desirable to provide simple and robust techniques for designing a comparator incorporating amplitude hysteresis, and to provide such a comparator with adjustable threshold voltages. It would be further desirable to enable such a comparator to accommodate input common-mode voltages over the entire supply voltage range.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
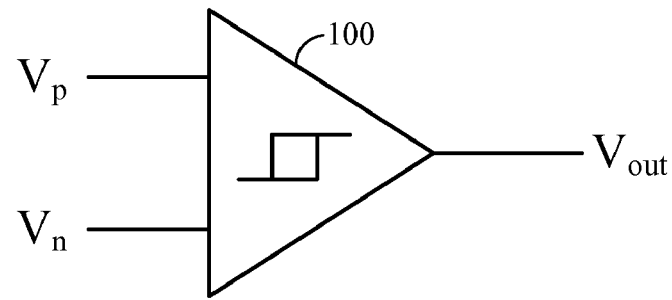
FIGS. 1 and 1A illustrate the functionality of a comparator incorporating amplitude hysteresis according to the present disclosure.
Figure 1A:
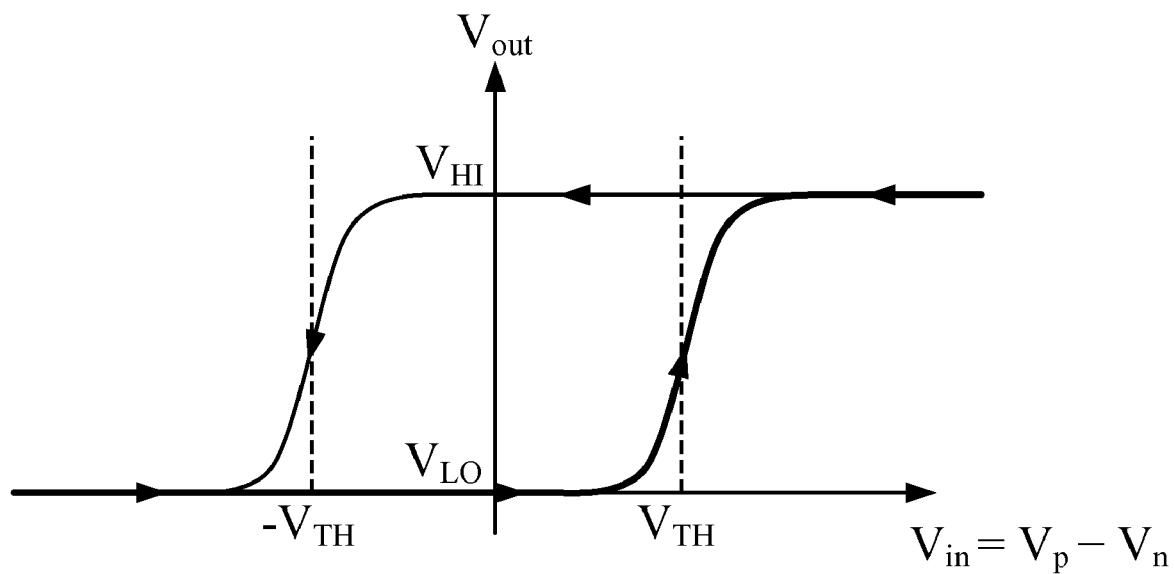

FIGS. 1 and 1A illustrate the functionality of a comparator 100 incorporating amplitude hysteresis according to the present disclosure. In FIG. 1, a positive input voltage $V_p$ and a negative input voltage $V_n$ are provided to comparator 100 to generate an output voltage $V_{out}$. In FIG. 1A, the input voltage $V_{in}$, computed as the difference $V_p - V_n$, is seen to control the output voltage $V_{out}$ as shown in FIG. 1A.

In FIG. 1A, when $V_{in}$ is initially less than a voltage $-V_{TH}$, $V_{out}$ is seen to be at a logical low voltage $V_{LO}$. As $V_{in}$ increases to greater than a low-to-high threshold voltage $V_{TH}$, $V_{out}$ switches to a logical high voltage $V_{HI}$. From $V_{out}$ being at $V_{HI}$, if $V_{in}$ subsequently decreases to less than a high-to-low threshold voltage $-V_{TH}$, $V_{out}$ will switch from $V_{HI}$ to $V_{LO}$.

The switching behavior described above is also referred to as amplitude hysteresis, and is well-known to one of ordinary skill in the art. Amplitude hysteresis advantageously reduces false triggering of the comparator output $V_{out}$ in the presence of noise coupled to the input voltage $V_{in}$. It would be desirable to design a comparator incorporating amplitude hysteresis in an integrated circuit, and to further provide simple techniques to adjust the threshold voltage $V_{TH}$ to control the amount of hysteresis introduced.

Figure 2:
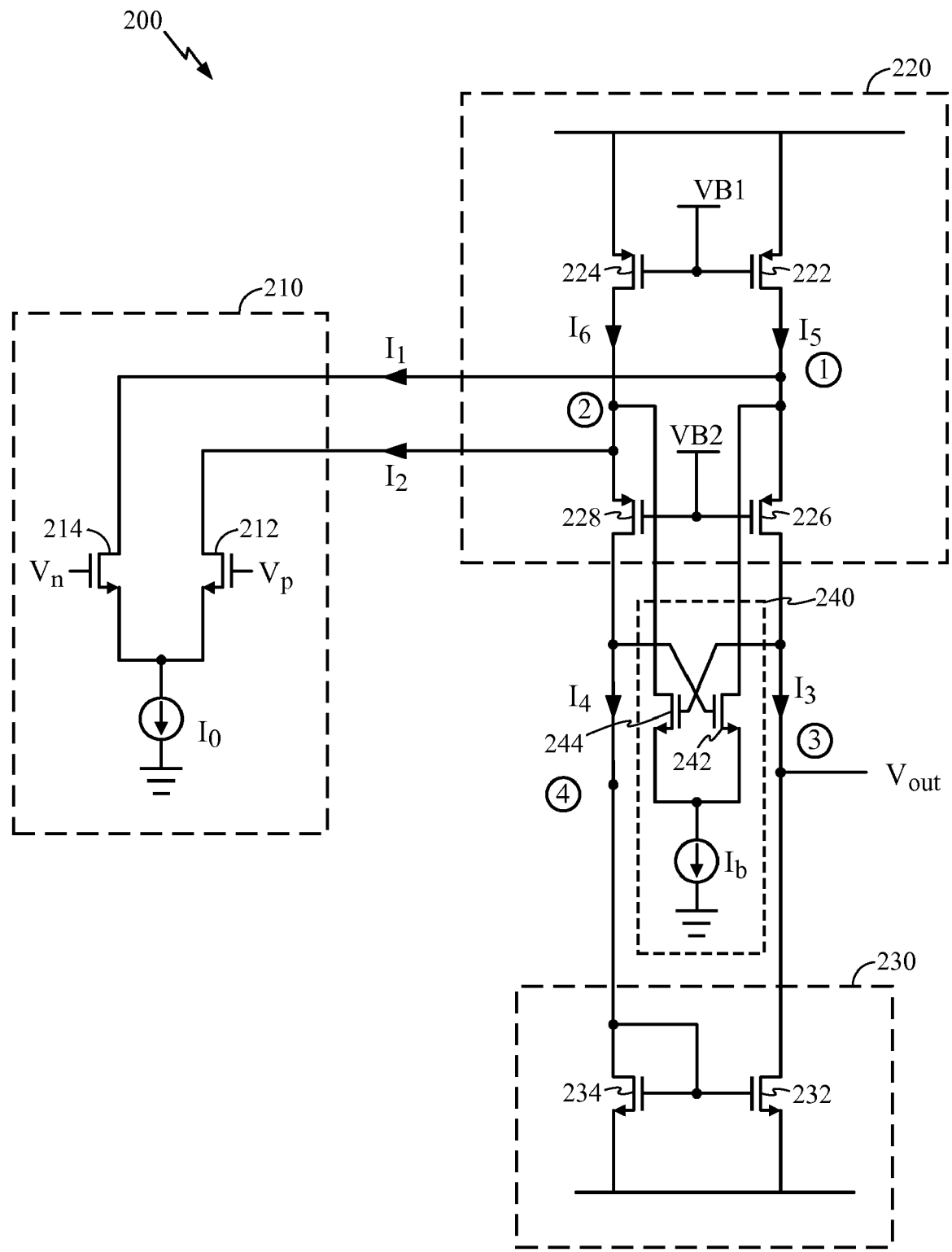
FIG. 2 illustrates an exemplary embodiment of a comparator exhibiting amplitude hysteresis according to the present disclosure.

FIG. 2 illustrates an exemplary embodiment 200 of a comparator incorporating amplitude hysteresis according to the present disclosure.

In FIG. 2, the comparator 200 includes an input stage 210, a folded cascode stage 220, a load 230, and a current offset stage 240.

Input stage 210 includes an NMOS differential pair 212 and 214 coupled to the input voltages $V_p$ and $V_n$, respectively. NMOS differential pair 212, 214 is sourced by a current source generating a current $I_0$. The outputs (drains) of NMOS differential pair 212, 214 are coupled to nodes 2 and 1, respectively, in cascode stage 220. Nodes 1 and 2 are also referred to herein as cascode nodes. Note labeled nodes are generally shown as circled numbers in the accompanying figures.

Cascode stage 220 includes PMOS transistors 222, 224, 226, 228. The voltages at nodes 1 and 2 are coupled to nodes 3 and 4, respectively, via PMOS transistors 226 and 228. Transistors 226 and 228 are also referred to herein as cascode transistors. Transistors 222 and 224 may be biased using a bias voltage VB1, while transistors 226 and 228 may be biased using a bias voltage VB2.

Nodes 3 and 4, also referred to herein as loading nodes, are coupled to the drains of NMOS transistors 232 and 234, respectively, of load 230. Note transistor 234 of load 230 is diode-connected, according to principles well-known to one of ordinary skill in the art.

The output voltage of the comparator 200 is taken as the voltage at node 3, also labeled $V_{out}$ in FIG. 2.

In the exemplary embodiment shown, a current offset stage 240 is coupled to nodes 1, 2, 3, and 4 of the comparator 200. Current offset stage 240 includes NMOS transistors 242 and 244. The gates of transistors 242 and 244 are coupled to nodes 4 and 3, respectively, while the drains of transistors 242 and 244 are coupled to nodes 1 and 2, respectively. The current offset stage 240 is configured to selectively divert current generated by the input stage 210 away from the cascode stage 220 to delay full-swing switching of the output voltage $V_{out}$, thereby introducing hysteresis, in accordance with principles described hereinbelow.

Assume initially that $(V_p-V_n) \ll -V_{TH}$ in FIG. 2, wherein $V_{TH}$ is defined as $$\frac{I_b}{g_m},$$

for reasons that will later be made clear herein. Then the current $I_0$ sourcing the input stage 210 is entirely directed through transistor 214, while transistor 212 supports no current, i.e., $I_1 = I_0$, while $I_2 = 0$. Further, in this initial state, $V_{out}$ at node 3 is assumed to be at $V_{LO}$, while the voltage at node 4 is assumed to be higher than the voltage at node 3, causing the current $I_b$ acting as a current sink in the offset stage 240 to be entirely directed through transistor 242. In this state, the current offset stage 240 is configured to pull a net current $I_b$ away from node 1. It is assumed that $I_b$ is less than $I_0$.

Consequently, $I_3$ is seen to be equal to $I_5 - I_1 - I_b$, while $I_4$ is seen to be equal to $I_6$, wherein $I_5$ and $I_6$ are the currents generated by current source transistors 222 and 224, respectively, and $I_5$ is assumed to be equal to $I_6$.

As $(V_p - V_n)$, or $V_{in}$, is gradually increased, i.e., made less negative, the current $I_0$ will gradually split more evenly between transistors 212 and 214 of input stage 210 until, at $V_p = V_n$, $$I_1 = I_2 = \frac{I_0}{2},$$

whereupon $$I_3 = I_5 - \frac{I_0}{2} - I_b,$$

and $$I_4 = I_6 - \frac{I_0}{2}.$$

As $(V_p - V_n)$ is further increased, $I_3$ will further increase while $I_4$ will further decrease. When $I_3$ eventually exceeds $I_4$, the voltages at node 3 and 4 will switch from their initial values of $V_{LO}$ and $V_{HI}$, respectively, to $V_{HI}$ and $V_{LO}$, respectively. The condition at which switching occurs may be expressed as follows:

| | |
|---|---|
| $I_3 > I_4$; | (Expression 1a) |
| $I_5 - (I_1 + I_b) > I_6 - I_2$; | (Expression 1b) |
| $I_2 > I_1 + I_b$; | (Expression 1c) |
| $I_2 - I_1 > I_b$; and | (Expression 1d) |
| $g_m \cdot (V_p - V_n) > I_b$; | (Expression 1e) | wherein the last relationship results from the fact that the differential current $(I_2 - I_1)$ of the differential pair 212, 214 is equal to the differential transconductance $g_m$ of the input stage 210 times the input voltage difference $(V_p - V_n)$.

From the above discussion, one of ordinary skill in the art will appreciate that $V_{out}$ of the comparator 200 at node 3 will switch from $V_{LO}$ to $V_{HI}$ when $V_{in}$ exceeds the quantity $$\frac{I_b}{g_m}.$$

As earlier described, this quantity is also referred to as $V_{TH}$, and corresponds to the low-to-high threshold voltage $V_{TH}$ described with reference to FIG. 1A for a comparator incorporating amplitude hysteresis.

In light of the above description, and adopting similar arguments, one of ordinary skill in the art will further appreciate that when the input voltage to comparator 200 is initially at $(V_p - V_n) \gg V_{TH}$, the output voltage $V_{out}$ will similarly remain at $V_{HI}$ with decreasing $(V_p - V_n)$, until $(V_p - V_n) < -V_{TH}$, upon which $V_{out}$ will subsequently transition to $V_{LO}$. The comparator 200 thus fully implements the amplitude hysteresis earlier described with reference to FIG. 1A.

One of ordinary skill in the art will appreciate that for the exemplary embodiment shown, the threshold voltages $V_{TH}$ and $-V_{TH}$ are advantageously well-defined by the term $$\frac{I_b}{g_m},$$

and thus the hysteresis of the comparator is easily controlled by selecting appropriate values for $I_b$ and $g_m$. In an exemplary embodiment, $I_b$ may be designed to be approximately 1-2 µA, while $I_0$, which controls $g_m$, may be designed to be approximately 25 µA.

Figure 2A:
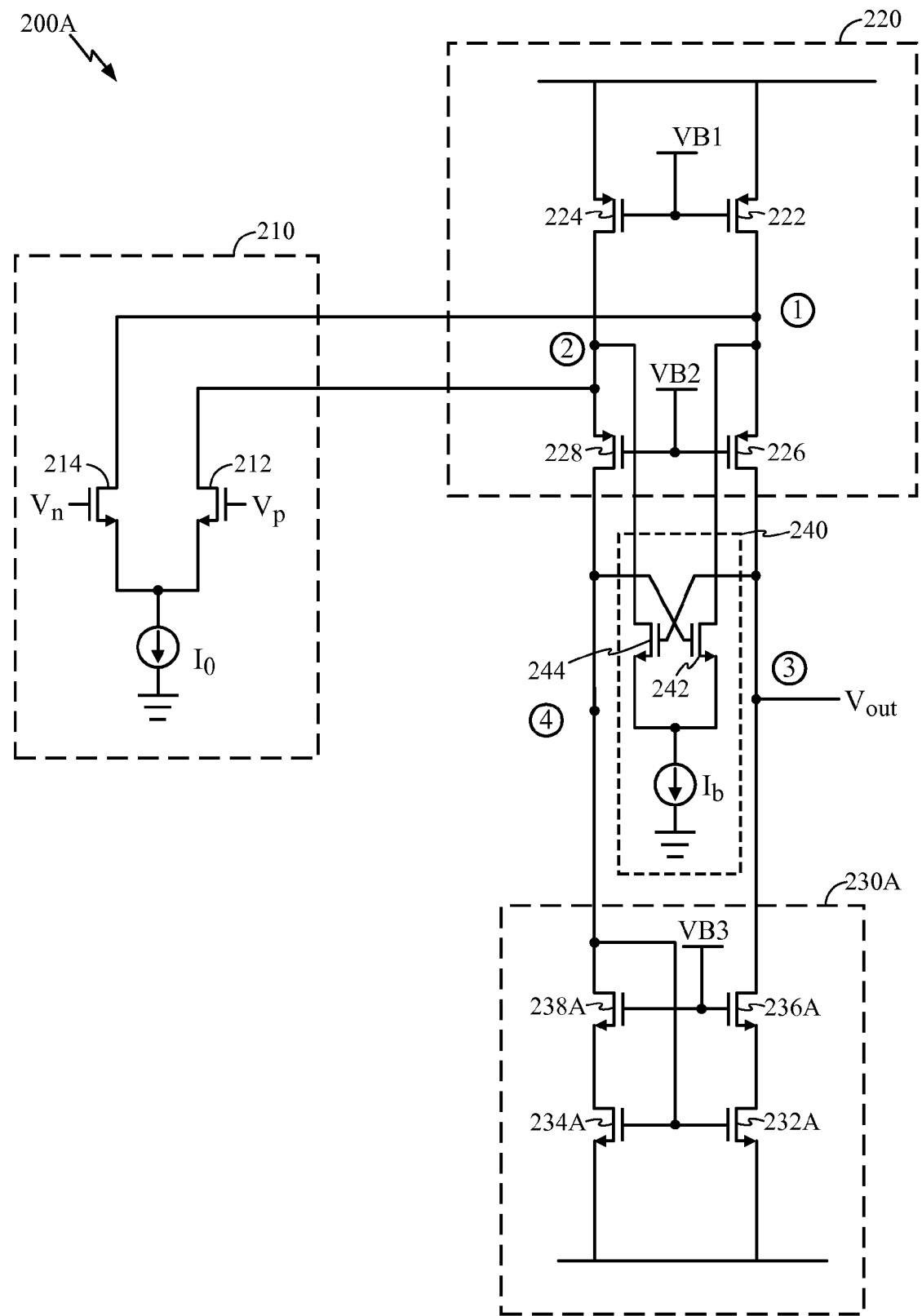
FIGS. 2A, 3, and 3A illustrate alternative exemplary embodiments of a comparator incorporating amplitude hysteresis according to the present disclosure.

While the load 230 in FIG. 2 is shown configured as a "current mirror load" well-known in the art, one of ordinary skill in the art will appreciate that other loads may be readily substituted for load 230 without departing from the scope of the present disclosure. FIG. 2A illustrates an alternative exemplary embodiment 200A of a comparator incorporating a different type of load. Note similarly labeled blocks in FIG. 2A and FIG. 2 have similar functions, unless otherwise noted. In FIG. 2A, the load 230A includes transistors 232A, 234A, 236A, and 238A, configured as a so-called "cascode current mirror" known to one of ordinary skill in the art. Such alternative exemplary embodiments, as well as exemplary embodiments incorporating loads not explicitly described herein, are contemplated to be within the scope of the present disclosure.

Figure 3:
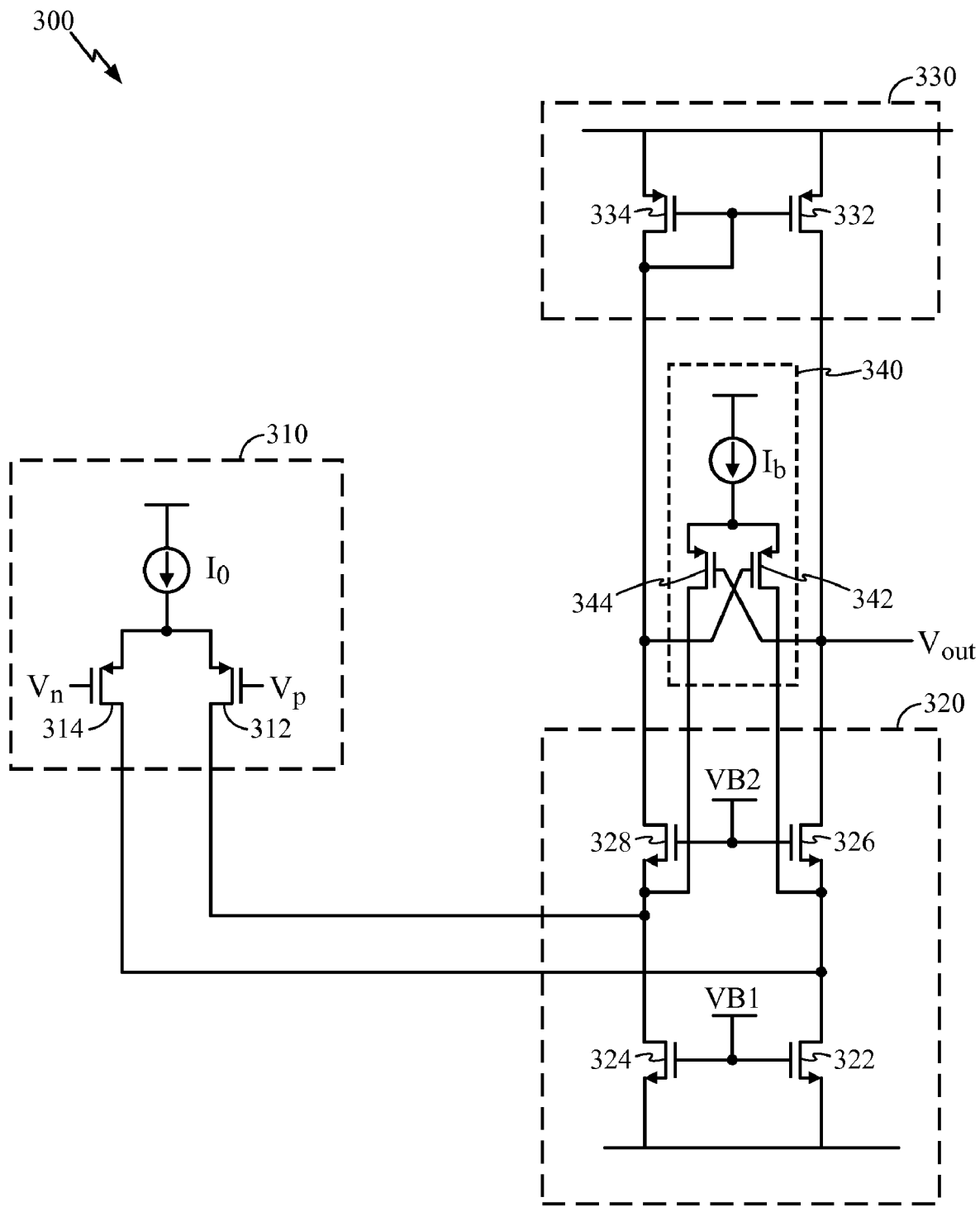

FIG. 3 illustrates an alternative exemplary embodiment 300 of a comparator incorporating amplitude hysteresis according to the present disclosure. One of ordinary skill in the art will appreciate that comparator 300 has a structure similar to comparator 200 described in FIG. 2, using transistors complementary (i.e., NMOS for PMOS, and vice versa) to the corresponding transistors of comparator 200.

Figure 3A:
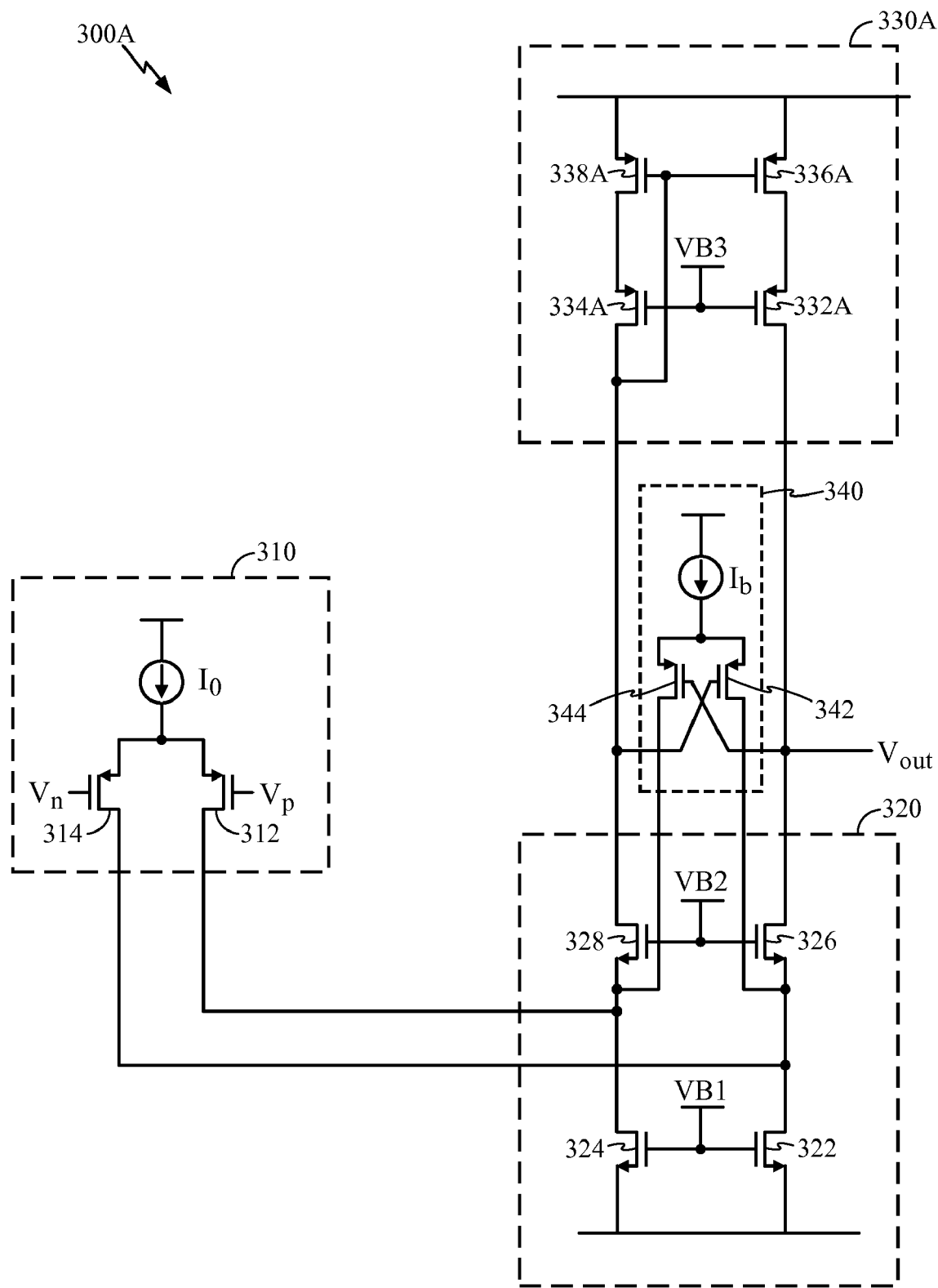

FIG. 3A illustrates an alternative exemplary embodiment 300A of a comparator incorporating amplitude hysteresis. Note similarly labeled blocks in FIG. 3A and FIG. 3 have similar functions, unless otherwise noted. In FIG. 3A, the load 330A includes transistors 332A, 334A, 336A, and 338A, configured as a cascode PMOS current mirror known to one of ordinary skill in the art.

Figure 4:
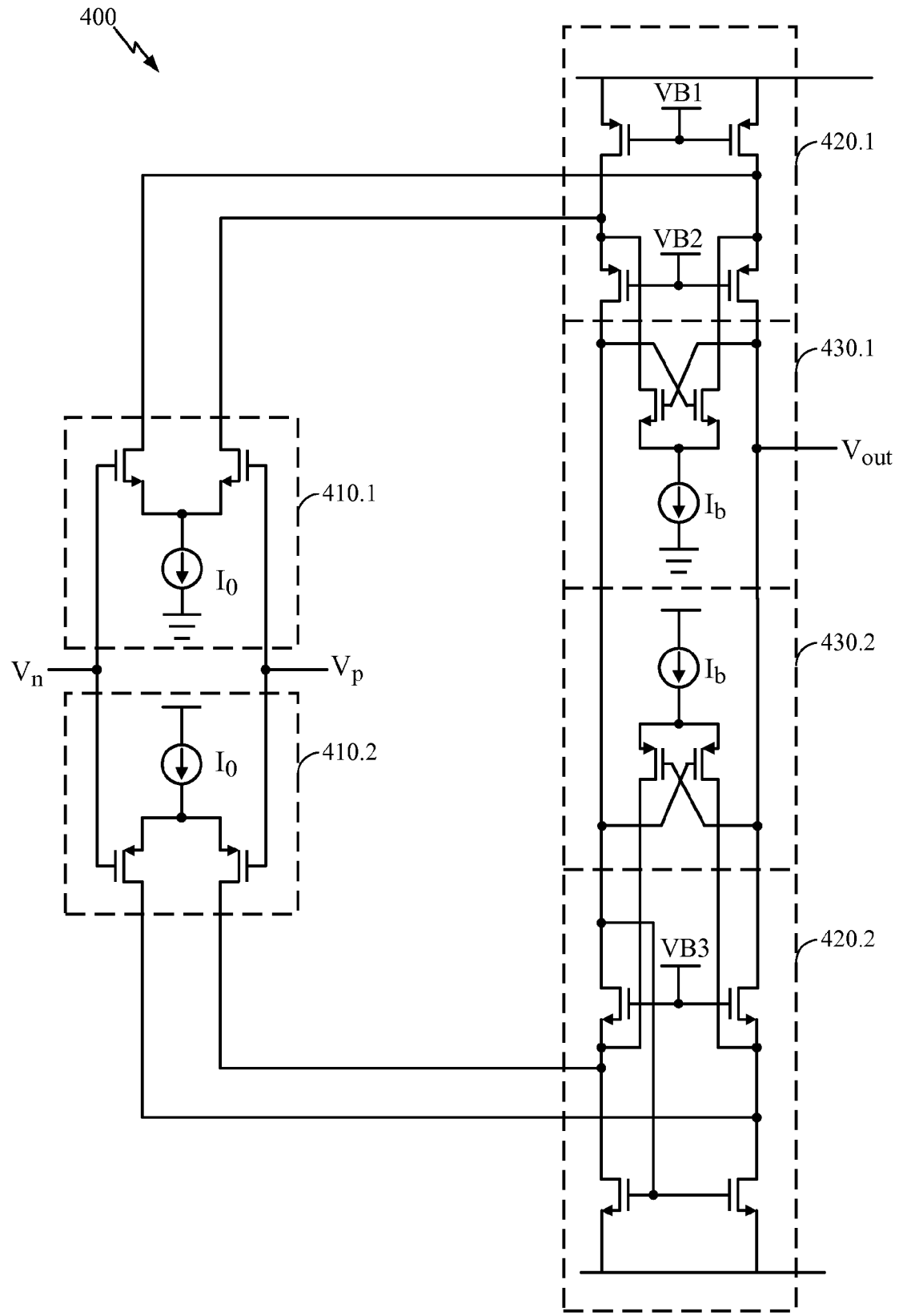
FIGS. 4 and 5 illustrate exemplary embodiments of a comparator with a rail-to-rail input stage according to the present disclosure.

FIG. 4 illustrates an alternative exemplary embodiment 400 of a comparator incorporating amplitude hysteresis according to the present disclosure. Comparator 400 includes both an NMOS input stage 410.1 and a PMOS input stage 410.2. By providing complementary NMOS and PMOS input stages, along with corresponding cascode, load, and current offset stages, as further described hereinbelow, it will be appreciated that comparator 400 advantageously accommodates rail-to-rail input common-mode voltages, i.e., input common-mode voltages ranging over the entire supply voltage.

In FIG. 4, the outputs of the input stages 410.1 and 410.2 are coupled to the cascode stages 420.1 and 420.2, respectively. It will be appreciated that cascode stage 420.1 also functions as a cascode load for the PMOS input stage 410.2 and cascode stage 420.2, while cascode stage 420.2 also functions as a cascode current mirror load for NMOS input stage 410.1 and cascode stage 420.1.**

According to the principles earlier described herein, current offset stages 430.1 and 430.2 are provided to implement the hysteresis techniques of the present disclosure. The operation of stages 430.1 and 430.2 in comparator 400 will be clear to one of ordinary skill in the art in light of the principles earlier described herein.

Figure 5:
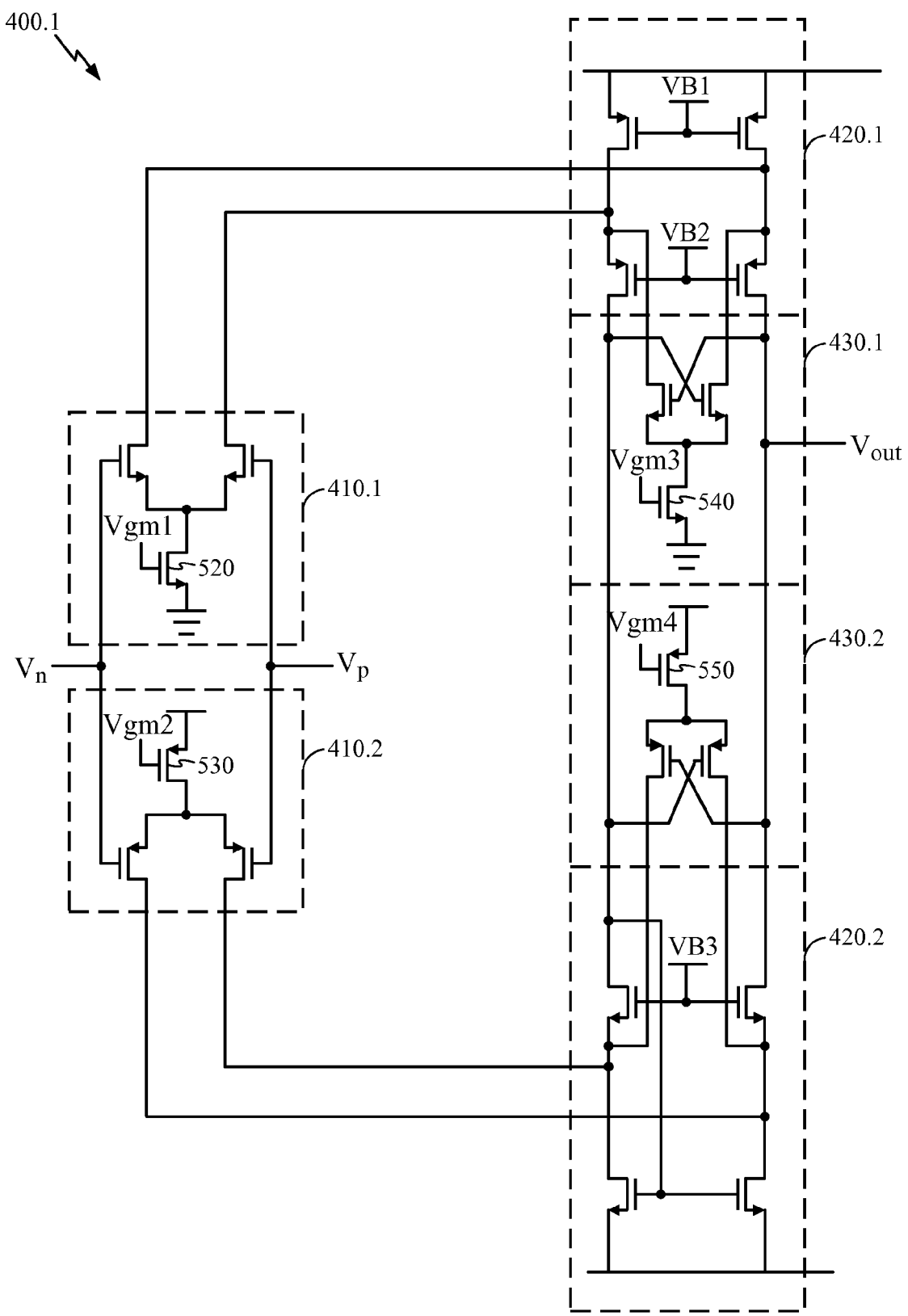

FIG. 5 illustrates an exemplary embodiment 400.1 of comparator 400 with rail-to-rail input stage. In FIG. 5, current sources for the NMOS and PMOS input stages 410.1 and 410.2 are implemented as NMOS transistor 520 and PMOS transistor 530, respectively. Similarly, current sources for the current offset stages 430.1 and 430.2 are implemented as NMOS transistor 540 and PMOS transistor 550, respectively.

One of ordinary skill in the art will appreciate that by setting the voltages Vgm1 and Vgm2 biasing transistors 520 and 530, respectively, the transconductance $g_m$ of the input stages 410.1 and 410.2 may be controlled, while by setting the voltages Vgm3 and Vgm4 biasing transistors 540 and 550, respectively, the current $I_b$ of the current offset stages 430.1 and 430.2 may also be controlled. Thus the amount of amplitude hysteresis in comparator 400.1 may be controlled by selecting appropriate values for the bias voltages Vgm1 through Vgm4.

Figure 6A:
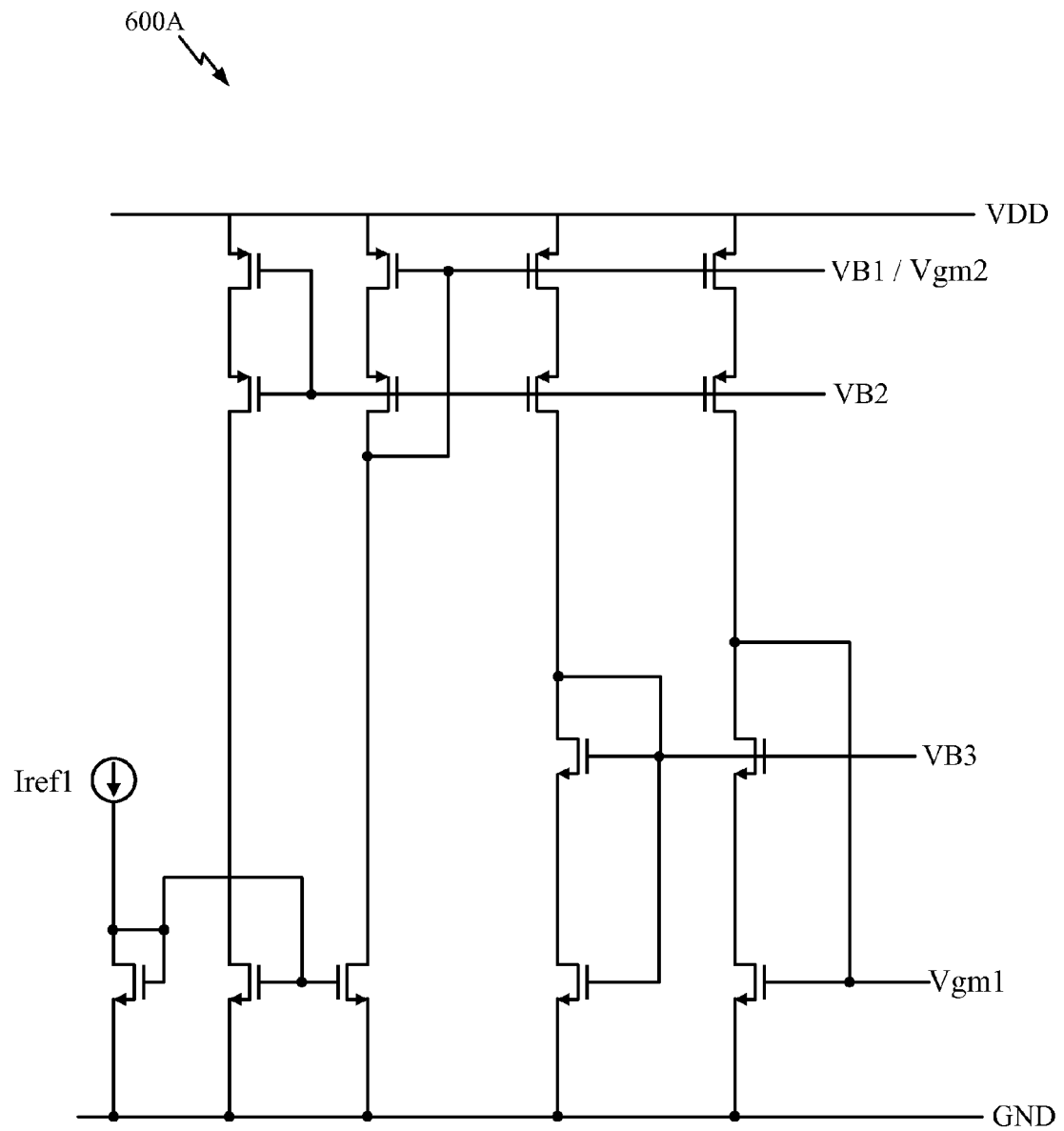
FIGS. 6A and 6B illustrate exemplary embodiments of biasing circuits for generating bias voltages VB1, VB2, VB3, Vgm1, Vgm2, Vgm3, and Vgm4 according to the present disclosure.
Figure 6B:
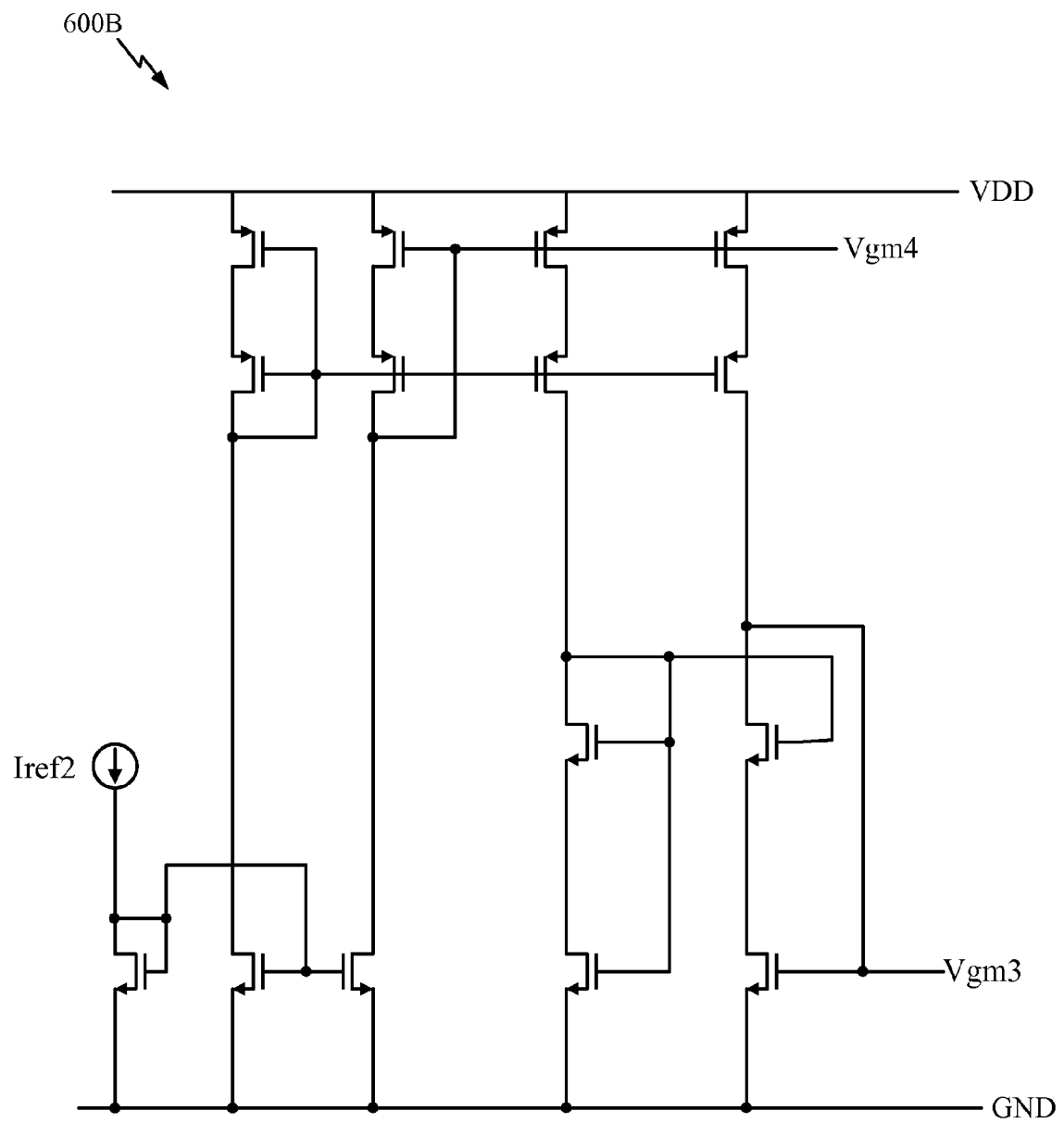

FIG. 6A illustrates an exemplary embodiment 600A of a biasing circuit for generating bias voltages VB1, VB2, VB3, Vgm1, and Vgm2 for comparator 400.1 of FIG. 5. FIG. 6B illustrates an exemplary embodiment 600B of a biasing circuit for generating bias voltages Vgm3 and Vgm4 for comparator 400.1 of FIG. 5. The operation of the biasing circuits 600A and 600B will be clear to one of ordinary skill in the art. In particular, one of ordinary skill in the art will appreciate that by providing reference currents Iref1 and Iref2 in FIGS. 6A and 6B, and by sizing and matching the transistors according to principles well-known in the art of circuit design and layout, the bias currents and voltages in the comparator 400.1 may be appropriately chosen to set the desired amount of amplitude hysteresis. The biasing circuits 600A and 600B may be designed according to principles well-known to one of ordinary skill in the art.

In an exemplary embodiment, Iref1 and Iref2 may be chosen to have different characteristics from each other, such that the hysteresis levels achieved within the comparator are consistent over a wide manufacturing process range and temperature range. For example, Iref1 may be chosen to provide a constant $g_m$ bias for the input stage 410.1, 410.2, while Iref2 may be chosen to provide a constant (fixed) bandgap current for $I_b$, according to principles known to one of ordinary skill in the art.

Figure 6C:
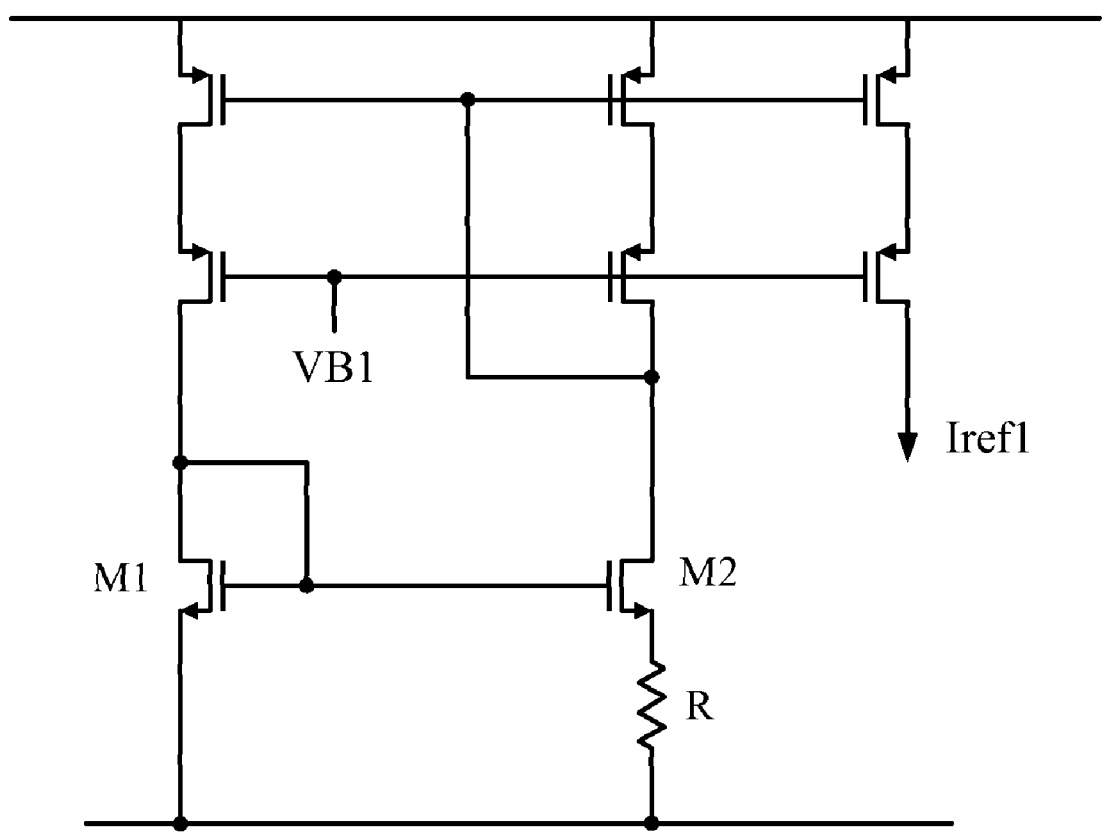
FIG. 6C illustrates an exemplary embodiment of a block for generating Iref1 to maintain relatively constant $g_m$ for the input stage of a comparator over, e.g., temperature variations.

FIG. 6C illustrates an exemplary embodiment 600C of a block for generating Iref1 to maintain relatively constant $g_m$ for the input stage of comparator 400.1 over, e.g., temperature variations. One of ordinary skill in the art will appreciate that by generating a voltage across the resistor R that is equal to the gate-to-source differential voltage between M1 and M2, the current Iref1 is made inversely proportional to the term β in the MOS transistor I-V characteristic equation:

$$I_D = \frac{\beta}{2}(V_{GS} - V_T)^2. \quad \text{(Expression 2)}$$

Since the transconductance $g_m$ of an ideal MOS amplifier is proportional to the square root of β, setting the bias current Iref1 to be inversely proportional to β advantageously allows the amplifier to achieve a constant $g_m$ or gain characteristic over temperature.

While an exemplary embodiment 600C of a block for generating Iref1 to maintain relatively constant $g_m$ has been illustrated in FIG. 6C, one of ordinary skill in the art will appreciate that alternative circuits well-known in the art may be used to achieve the same or similar purposes, and such alternative exemplary embodiments are also contemplated to be within the scope of the present disclosure.

Figure 7:
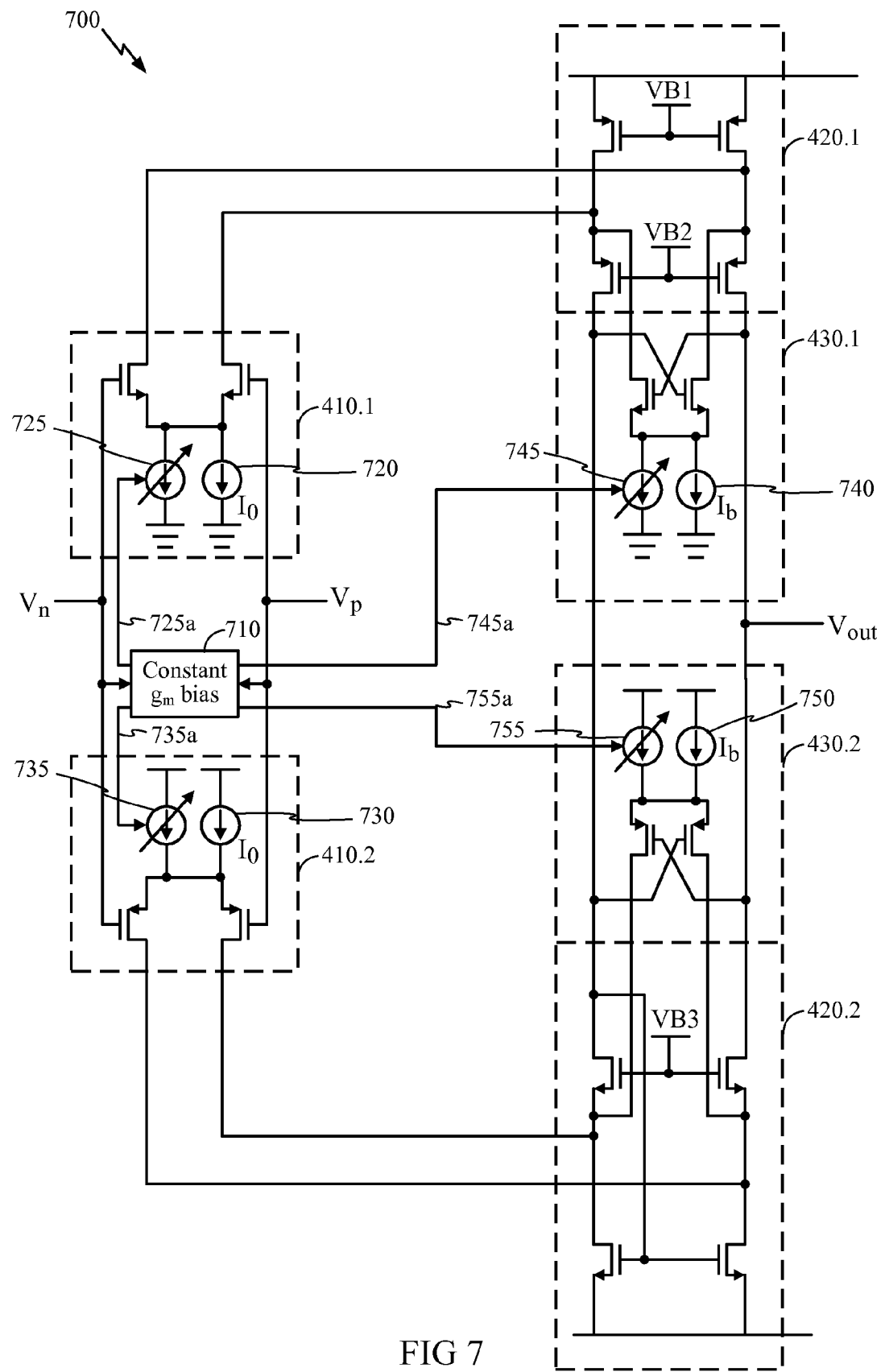
FIG. 7 illustrates an alternative exemplary embodiment of a comparator to maintain relatively constant $g_m$ and $I_b$ over, e.g., input common-mode voltage variations.

FIG. 7 illustrates an alternative exemplary embodiment 700 of a comparator to maintain relatively constant $g_m$ and $I_b$ over, e.g., input common-mode voltage variations. In FIG. 7, a constant $g_m$ bias block 710 senses the level of input voltages $V_p$ and $V_n$, and adjusts the currents provided by dynamic current sources 725 and 735 which, along with current sources 720 and 730, bias input stages 410.1 and 410.2. Block 710 also adjusts the currents provided by dynamic current sources 745 and 755 which, along with current sources 740 and 750, bias the current offset stages 430.1 and 430.2.

In an exemplary embodiment, the currents delivered by the dynamic current sources 725, 735, 745, and 755 are configured by block 710 such that $g_m$ and $I_b$ of the corresponding stages sourced by the dynamic current sources remain relatively constant. Constant $g_m$ bias block 710 may be configured to dynamically adjust the currents provided by the current sources to maintain constant $g_m$ and $I_b$, e.g., across variations in input common-mode voltage according to principles known to one of ordinary skill in the art of circuit design. In this manner, undesired variations in the hysteresis threshold voltages $V_{TH}$ and $-V_{TH}$ during normal circuit operation may be reduced.

Figure 7A:
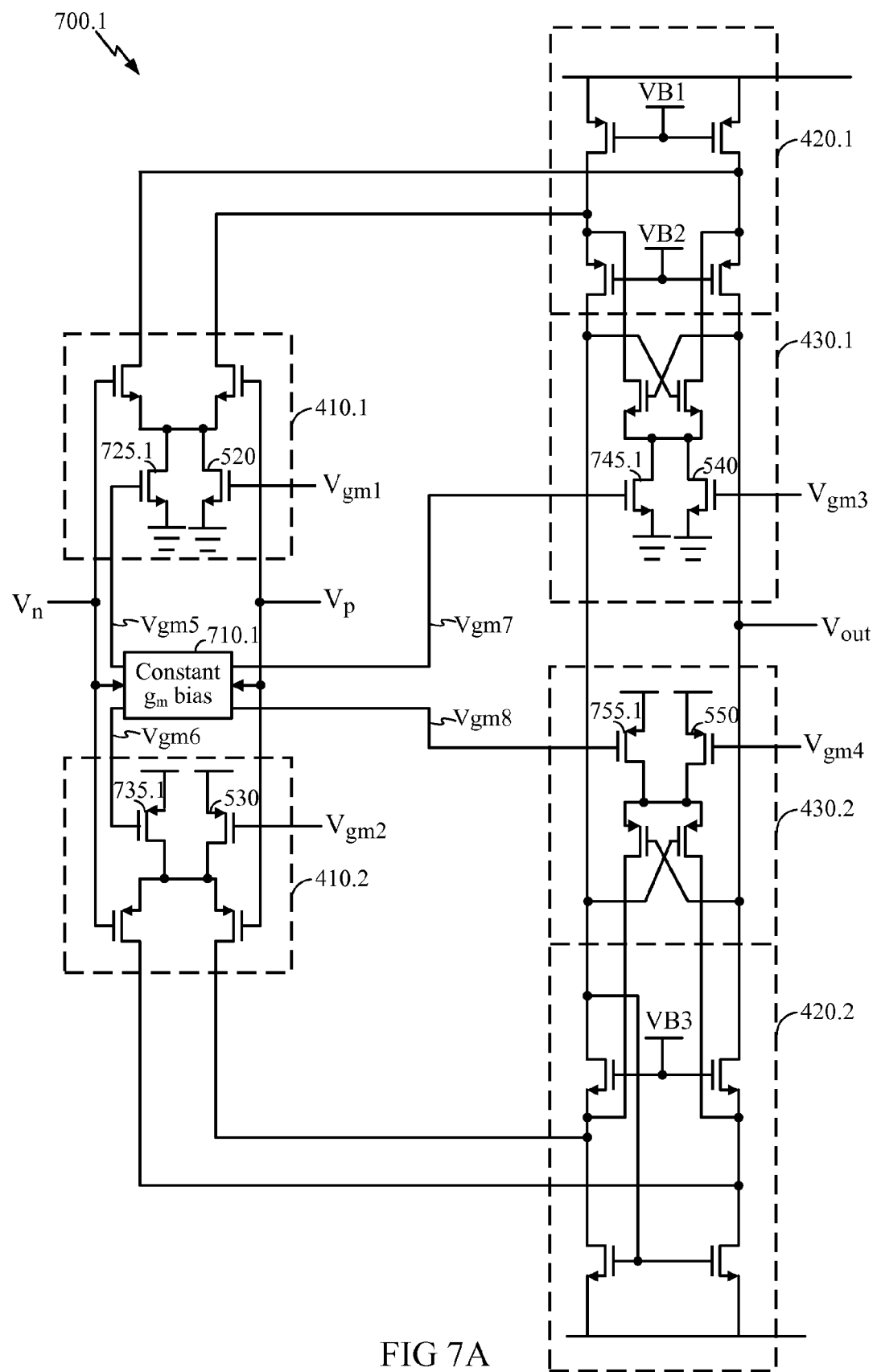
FIG. 7A illustrates a comparator employing an exemplary embodiment of a constant $g_m$ block.

FIG. 7A illustrates a comparator 700.1 employing an exemplary embodiment 710.1 of a constant $g_m$ block. In FIG. 7A, current sources 720 and 730 of comparator 700 are implemented as transistor current sources 520 and 530, similar to the embodiment 400.1 of FIG. 5. The current sources 725 and 735 of comparator 700 are implemented as transistor current sources 725.1 and 735.1. The generation by block 710.1 of bias voltages Vgm5 and Vgm6 biasing transistors 725.1 and 735.1, respectively, may preferably maintain a constant transconductance $g_m$ for the input stages 410.1 and 410.2 over variations in the input common-mode voltage, according to principles well-known to one of ordinary skill in the art of circuit design. See, e.g., Baker, R. Jacob, et al., *CMOS Circuit Design, Layout, and Simulation*, pp. 608-610 (1997). Current sources 745 and 755 of comparator 700 may be similarly implemented as transistor current sources 745.1 and 755.1, with bias voltages Vgm7 and Vgm8 similarly generated by block 710.1 to preferably maintain constant net current for sourcing the current offset stages 430.1 and 430.2. In an exemplary embodiment, block 710.1 may generate the bias voltages Vgm7 and Vgm8 to be the same as bias voltages Vgm5 and Vgm6, respectively.

While an exemplary embodiment 700.1 of a comparator designed to maintain relatively constant $g_m$ and $I_b$ over input common-mode voltage has been illustrated in FIG. 7A, one of ordinary skill in the art will appreciate that alternative circuits well-known in the art may be used to achieve the same purpose, and such alternative exemplary embodiments are also contemplated to be within the scope of the present disclosure.

Figure 8:
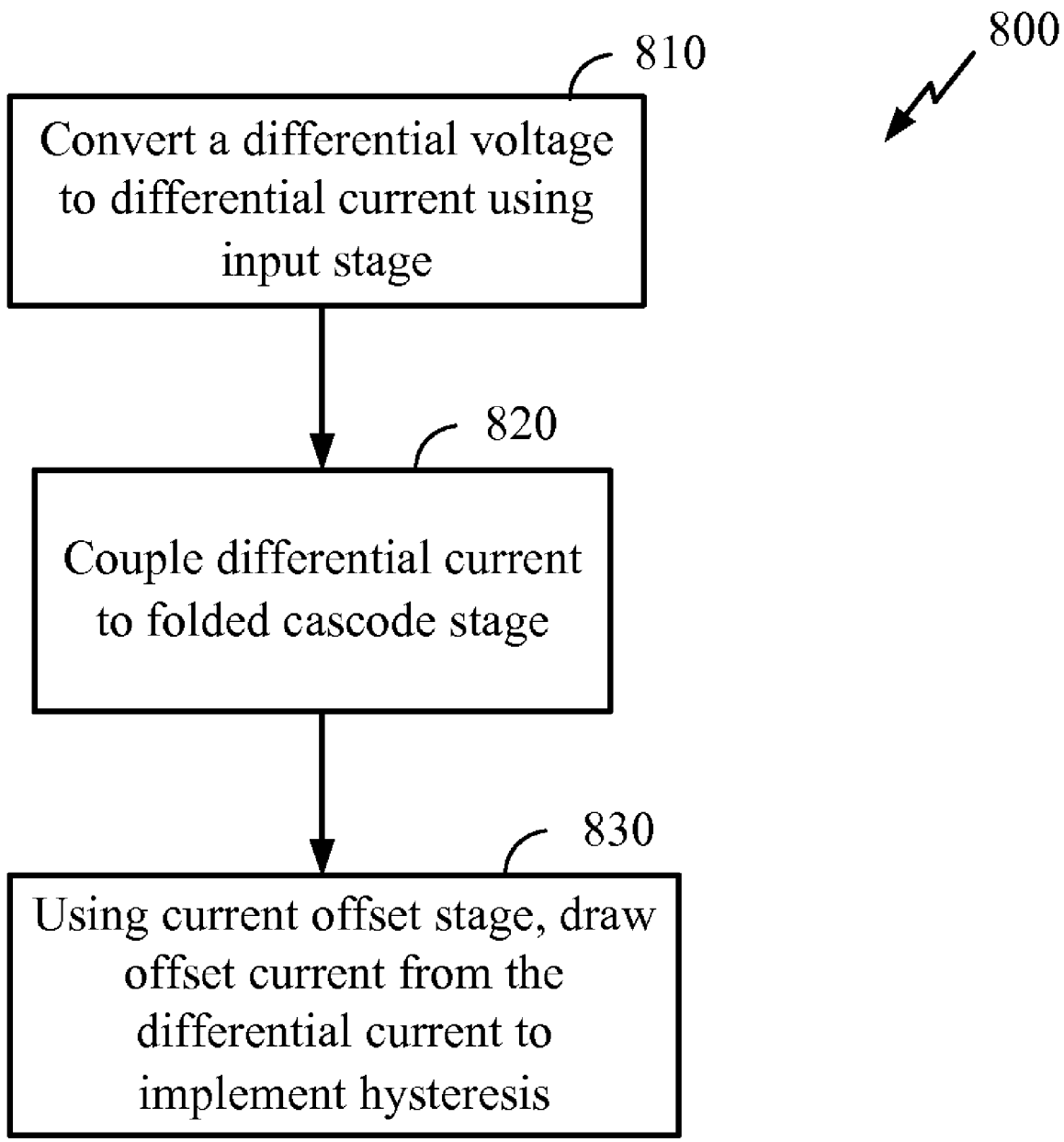
FIG. 8 illustrates an exemplary embodiment of a method according to the present disclosure.

FIG. 8 illustrates an exemplary embodiment of a method 800 according to the present disclosure. Note the method 800 is shown for illustrative purposes only, and is not meant to restrict the scope of the present disclosure to any particular method shown.

At step 810, a differential voltage is converted to a differential current using an input stage.

At step 820, the differential current is coupled to a folded cascode stage.

At step 830, using a current offset stage, offset current is drawn from the differential current to implement hysteresis.

One of ordinary skill in the art will appreciate that while exemplary embodiments of the present disclosure have been described with reference to MOS transistors (MOSFET's), the techniques of the present disclosure need not be limited to MOSFET-based designs, and may be readily applied to alternative exemplary embodiments (not shown) employing bipolar junction transistors (or BJT's) and/or other three-terminal transconductance devices. For example, in an exemplary embodiment (not shown), any of the comparators shown may utilize BJT's rather than MOSFET's, with the collectors, bases, and emitters of the BJT's coupled as shown for the drains, gates, and sources, respectively, of the MOSFET's. Alternatively, in BiCMOS processes, a combination of both CMOS and bipolar structures/devices may be employed to maximize the circuit performance. Furthermore, unless otherwise noted, in this specification and in the claims, the terms "drain," "gate," and "source" may encompass both the conventional meanings of those terms associated with MOSFET's, as well as the corresponding nodes of other three-terminal transconductance devices, such as BJT's, which correspondence will be evident to one of ordinary skill in the art of circuit design.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A comparator implementing hysteresis, the comparator comprising:
   an input stage comprising a differential pair coupled to an input current source, the input stage comprising a positive input terminal, a negative input terminal, and input stage output nodes;
   a folded cascode stage comprising first and second cascode nodes coupled to the input stage output nodes, the first and second cascode nodes further coupled to first and second loading nodes, respectively, via cascode transistors;
   a load coupled to the first and second loading nodes, the output of the comparator coupled to one of the loading nodes; and
   a current offset stage controlled by the first and second loading nodes and configured to increase current drawn from the first cascode node relative to current drawn from the second cascode node in response to the second loading node voltage being greater than the first loading node voltage, and vice versa.

2. The comparator of claim 1, the differential pair comprising NMOS transistors, the cascode transistors comprising PMOS transistors, the load comprising NMOS transistors, one of the NMOS transistors of the load having its drain coupled to its gate.

3. The comparator of claim 1, the differential pair comprising PMOS transistors, the cascode transistors comprising NMOS transistors, the load comprising PMOS transistors, one of the PMOS transistors of the load having its drain coupled to its gate.

4. The comparator of claim 1, the current offset stage comprising:
   first and second transistors sourced by a current $I_b$, the gate of the first transistor coupled to the first loading node, the gate of the second transistor coupled to the second loading node, the drain of the first transistor coupled to the second cascode node, the drain of the second transistor coupled to the first cascode node.

5. The comparator of claim 4, the current $I_b$ of the current offset stage being adjustable.

6. The comparator of claim 1, the input current source being adjustable.

7. The comparator of claim 4, the current $I_b$ and input current source being biased to maintain constant $g_m$ of the input stage over changes in circuit temperature.

8. The comparator of claim 4, the current $I_b$ and input current source being further biased by a constant $g_m$ generator, the constant $g_m$ generator configured to maintain constant $g_m$ of the input stage over changes in the input common-mode voltage.

9. The comparator of claim 1, the load comprising a pair of gate-coupled transistors complementary to the cascode transistors, one of the gate-coupled transistors having its gate coupled to its drain.

10. The comparator of claim 8, the load comprising first and second pairs of gate-coupled transistors complementary to the cascode transistors, the drains of the first pair of transistors coupled to the first and second loading nodes, the drains of the second pair of transistors coupled to the sources of the first pair of transistors, the gates of the second pair further coupled to the second loading node.

11. A comparator implementing hysteresis, the comparator comprising:
   an input stage comprising an NMOS differential pair coupled to an NMOS input current source and a PMOS differential pair coupled to a PMOS input current source, the input stage further comprising positive and negative input terminals coupled to the gates of the NMOS and PMOS differential pairs;
   a PMOS folded cascode stage coupled to the drains of the NMOS differential pair, the PMOS folded cascode stage comprising first and second PMOS cascode nodes coupled to the NMOS differential pair drains, the first and second PMOS cascode nodes further coupled to first and second loading nodes, respectively, via PMOS cascode transistors, the output of the comparator coupled to one of the loading nodes;
   an NMOS current offset stage controlled by the first and second loading nodes and configured to increase current drawn from the first PMOS cascode node relative to current drawn from the second PMOS cascode node in response to the second loading node voltage being greater than the first loading node voltage, and vice versa; and
   an NMOS folded cascode stage coupled to the drains of the PMOS differential pair, the NMOS folded cascode stage comprising first and second NMOS cascode nodes coupled to the PMOS differential pair drains, the first and second NMOS cascode nodes further coupled to the first and second loading nodes, respectively, via NMOS cascode transistors.

12. The comparator of claim 11, further comprising:
   a PMOS current offset stage configured to increase current sourced to the second NMOS cascode node relative to current sourced to the first NMOS cascode node in response to the second loading node voltage being greater than the first loading node voltage, and vice versa.

13. The comparator of claim 12, the NMOS current offset stage comprising first and second NMOS transistors sourced by an NMOS current source, the gate of the first NMOS transistor coupled to the first loading node, the gate of the second NMOS transistor coupled to the second loading node, the drain of the first NMOS transistor coupled to the second PMOS cascode node, the drain of the second NMOS transistor coupled to the first PMOS cascode node.

14. The comparator of claim 13, the PMOS current offset stage comprising first and second PMOS transistors sourced by a PMOS current source, the gate of the first PMOS transistor coupled to the first loading node, the gate of the second PMOS transistor coupled to the second loading node, the drain of the first PMOS transistor coupled to the second NMOS cascode node, the drain of the second PMOS transistor coupled to the first NMOS cascode node.

15. The comparator of claim 14, the currents provided by the NMOS and PMOS input current sources being configurable, the currents provided by the NMOS and PMOS current sources further being configurable.

16. A method for implementing hysteresis in a comparator, the method comprising:
   converting a differential voltage to a differential current using an input stage, the input stage comprising a differential pair coupled to an input current source, the input stage comprising a positive input terminal, a negative input terminal, and input stage output nodes, the differential voltage being the voltage difference between the voltages at the positive and negative input terminals;

coupling the differential current to a folded cascode stage, the folded cascode stage comprising first and second cascode nodes coupled to the input stage output nodes, the first and second cascode nodes further coupled to first and second loading nodes, respectively, via cascode transistors; and using a current offset stage controlled by the first and second loading nodes, increasing current drawn from the first cascode node relative to current drawn from the second cascode node in response to the second loading node voltage being greater than the first loading node voltage, and vice versa.

17. A method for implementing hysteresis in a comparator, the method comprising:

converting a differential voltage to differential currents using an input stage, the input stage comprising an NMOS differential pair coupled to an NMOS input current source and a PMOS differential pair coupled to a PMOS input current source, the input stage further comprising positive and negative input terminals coupled to the gates of the NMOS and PMOS differential pairs;

coupling a differential current generated by the NMOS differential pair to a PMOS folded cascode stage, the PMOS folded cascode stage comprising first and second PMOS cascode nodes coupled to the NMOS differential pair drains, the first and second PMOS cascode nodes further coupled to first and second loading nodes, respectively, via PMOS cascode transistors, the output of the comparator coupled to one of the loading nodes;

using an NMOS current offset stage controlled by the first and second loading nodes, increasing current drawn from the first PMOS cascode node relative to current drawn from the second PMOS cascode node in response to the second loading node voltage being greater than the first loading node voltage, and vice versa; and coupling a differential current generated by the PMOS differential pair to an NMOS folded cascode stage, the NMOS folded cascode stage comprising first and second NMOS cascode nodes coupled to the PMOS differential pair drains, the first and second NMOS cascode nodes further coupled to the first and second loading nodes, respectively, via NMOS cascode transistors.

18. The method of claim 17, further comprising:

using a PMOS current offset stage, increasing current sourced to the second NMOS cascode node relative to current sourced to the first NMOS cascode node in response to the second loading node voltage being greater than the first loading node voltage, and vice versa.

19. The method of claim 17, further comprising adjusting the NMOS and PMOS input current sources to maintain a constant transconductance $g_m$ of the input stage.

20. The method of claim 19, the adjusting the NMOS and PMOS input current sources to maintain a constant transconductance $g_m$ of the input stage comprising adjusting the NMOS and PMOS input current sources to maintain a constant transconductance $g_m$ of the input stage over changes in temperature.

21. The method of claim 19, the adjusting the NMOS and PMOS input current sources to maintain a constant transconductance $g_m$ of the input stage comprising adjusting the NMOS and PMOS input current sources to maintain a constant transconductance $g_m$ of the input stage over changes in input common-mode voltage.

22. A comparator implementing hysteresis, the comparator comprising:

an input stage means for converting a differential voltage to a differential current;

a folded cascode means for coupling through first and second cascode transistors the differential current to an output voltage;

a first and second loading means for converting the differential current to an output voltage; and a current offset means for offsetting the differential current by increasing the current drawn through the first cascode transistor in response to the second loading means voltage being greater than the first loading means voltage.

23. The comparator of claim 22, further comprising:

means for adjusting the amount of hysteresis in the comparator.

24. The comparator of claim 22, further comprising:

means for maintaining a constant $g_m$ of the input stage means.

25. The comparator of claim 23, further comprising:

means for maintaining a constant $I_b$ of the current offset means.

* * * * *